United States Patent
Burger

(10) Patent No.: US 7,426,781 B2
(45) Date of Patent: Sep. 23, 2008

(54) PLACEMENT UNIT FOR MOUNTING ELECTRIC COMPONENTS ONTO SUBSTRATES

(75) Inventor: Stefan Burger, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 332 days.

(21) Appl. No.: 10/545,615

(22) PCT Filed: Jul. 16, 2004

(86) PCT No.: PCT/EP2004/051521

§ 371 (c)(1),
(2), (4) Date: Aug. 17, 2005

(87) PCT Pub. No.: WO2005/025287

PCT Pub. Date: Mar. 17, 2005

(65) Prior Publication Data

US 2006/0242821 A1    Nov. 2, 2006

(30) Foreign Application Priority Data

Sep. 5, 2003   (DE) ............................... 103 41 069

(51) Int. Cl.
*H05K 13/04*    (2006.01)

(52) U.S. Cl. ............................. 29/740; 29/741; 29/743; 29/832; 294/64.1

(58) Field of Classification Search ........... 29/740–743, 29/759, 832, 834, 703, 719–722, DIG. 44; 414/737, 752.1; 294/64.1, 64.2, 88, 907; 901/40, 47, 37

See application file for complete search history.

(56) References Cited

U.S. PATENT DOCUMENTS

| 5,029,383 | A | | 7/1991 | Snyder et al. |
| 5,285,946 | A | * | 2/1994 | Tomigashi et al. ............. 228/9 |
| 5,308,132 | A | | 5/1994 | Kirby et al. |
| 5,410,801 | A | | 5/1995 | Shiloh et al. |
| 5,422,554 | A | * | 6/1995 | Rohde .................... 318/568.21 |
| 5,644,279 | A | * | 7/1997 | Piper et al. .................. 335/228 |

(Continued)

FOREIGN PATENT DOCUMENTS

DE    39 38 088 A1    5/1991

(Continued)

OTHER PUBLICATIONS

Derwent Abstract—WO03/001572A; Jun. 26, 2001; Datacon Semi-conductor Equipment GMBH, A-6240 Radfeld/Tirol, Austria.

(Continued)

*Primary Examiner*—Minh Trinh

(57) ABSTRACT

A placement unit for mounting electric components onto substrates has means for moving perpendicularly to the substrate, a housing, a built-in, rotatable holder for the components, and a rotary drive for the holder mounted within the housing. The holder is connected via an axially elastic coupling to the rotary drive in a manner which is at least temporarily torsionally rigid, wherein the coupling includes a separable coupling having coupling elements arranged to be uncoupled in an axial direction. The holder is pre-stressed axially toward the component against the rotary drive by an adjustable pressure device, wherein the coupling surfaces of the coupling elements form an axial stop for the holder, and wherein the coupling surfaces separate from one another by an axial application force that acts on the holder and prevails over the axial pre-stress.

10 Claims, 1 Drawing Sheet

U.S. PATENT DOCUMENTS

| | | | |
|---|---|---|---|
| 6,178,621 B1 * | 1/2001 | Shida et al. | 29/740 |
| 6,250,538 B1 * | 6/2001 | Grasmueller et al. | 228/179.1 |
| 6,298,547 B1 * | 10/2001 | Okuda et al. | 29/740 |
| 6,328,362 B1 * | 12/2001 | Isogai et al. | 294/64.1 |
| 6,446,333 B1 | 9/2002 | Kashiwagi et al. | |
| 6,550,134 B2 * | 4/2003 | Asai et al. | 29/833 |
| 6,735,853 B2 * | 5/2004 | Lee | 29/739 |
| 7,059,036 B2 * | 6/2006 | Okuda et al. | 29/740 |

FOREIGN PATENT DOCUMENTS

| | | |
|---|---|---|
| DE | 195 14 686 A1 | 10/1996 |
| EP | 05 52 920 A1 | 7/1993 |
| WO | WO 03/001572 A | 6/2001 |
| WO | WO 02/26012 A1 | 3/2002 |

OTHER PUBLICATIONS

Derwent Abstract—DE-39 38 088 A1; May 23, 1991; Robert Bosch GmbH, D-7000 Stuttgart, Germany.

Derwent Abstract—DE-195 14 686 A1; Oct. 24, 1996; Samsung Electronics Co. Ltd., Kyungki-Do, Croatia.

* cited by examiner

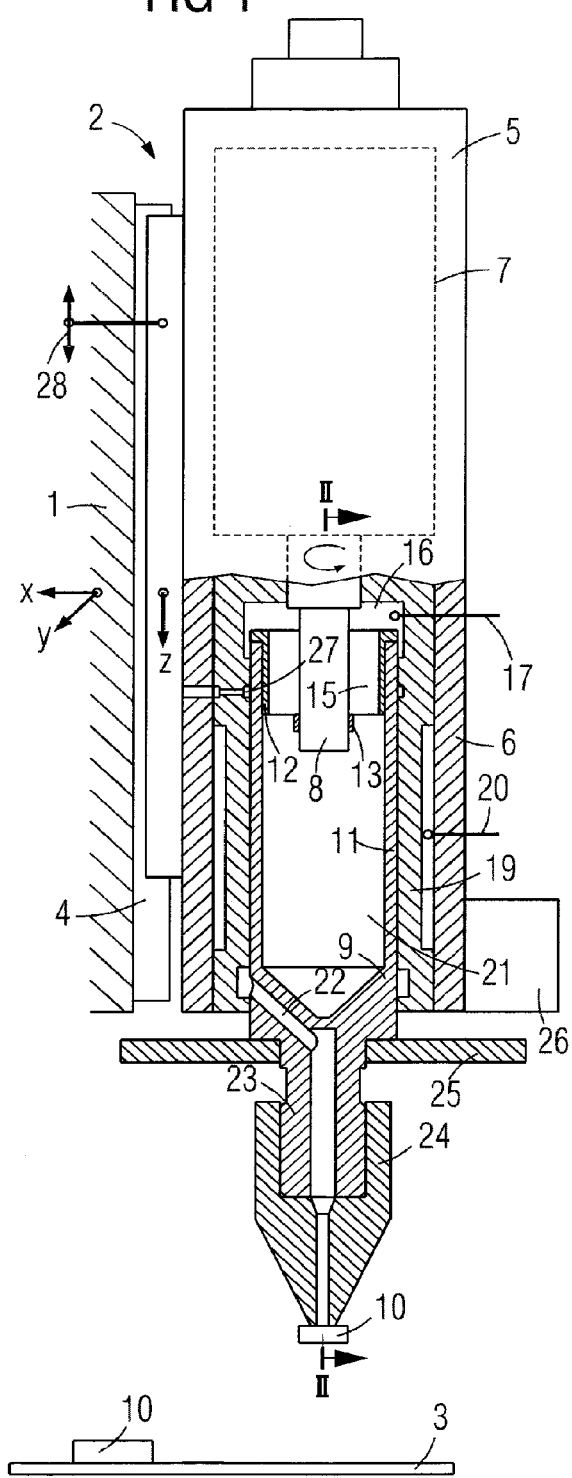
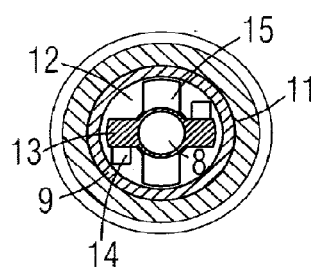
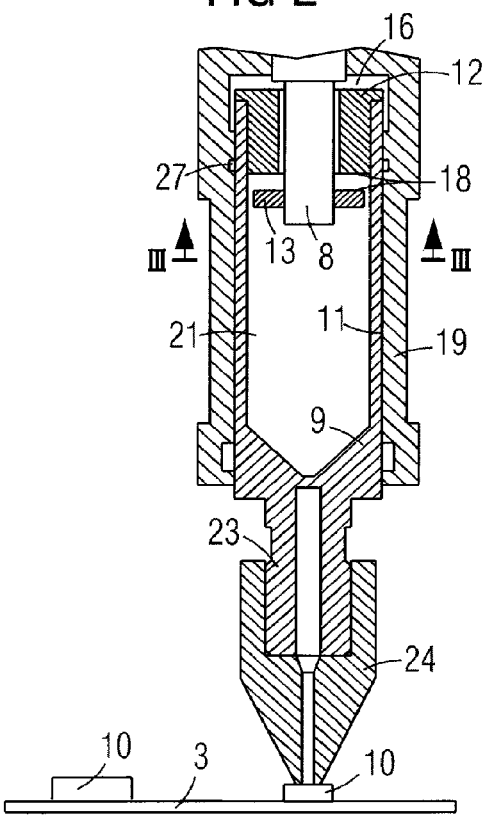

PLACEMENT UNIT FOR MOUNTING ELECTRIC COMPONENTS ONTO SUBSTRATES

The invention relates to a placement unit for mounting electric components onto substrates, the placement unit having a housing, a built-in, rotatable holder for the components and, mounted within the housing, a rotary drive for the holder, said holder being connected in a torsionally rigid manner to the rotary drive via an axially elastic coupling.

Such a placement unit was disclosed for example in document U.S. Pat. No. 6,178,621 B. Such a placement unit is part of a pick-and-place system in which electrical components are made available in a picking area and placed in a component placement area on an electrical printed circuit board. A pneumatic buffer having modifiable operating pressure is provided between the rotary drive and the component holder. This buffer makes it possible to set the application forces to different maximum values, depending on the components concerned.

Furthermore document WO 03/001572 A discloses a placement unit in which a rotary drive is connected in a torsionally rigid manner to the holder via metal bellows which are not only laterally displaceable but also compressible in the placement direction. At its inner end the holder has an anchoring element to which electromagnets apply a magnetic force, the strength of which can be preset. The magnetic force can be adapted to the maximum permitted limits of the different components by altering the supply of current to the electromagnets. The holder is moreover inserted in a radial arbor yoke which is designed as an air bearing and so has no static friction. When tuning the application force it is necessary to take into account not only the magnetic force, but also the spring loading applied by the metal bellows, as well as the intrinsic weight of the holder. Limitation of the application force is particularly important in the case of small, pressure-sensitive components.

In the case of the placement unit disclosed in document U.S. Pat. No. 5,029,383, the placement tip is held loosely and virtually without friction opposite to a holder, in an air bearing shaped like a hollow sphere, so that the placement tip can adjust during placement to the shape of the component that needs to be picked up. Then only the weight-loading of the placement tip has any effect on the component. In order to pick up a component, a partial vacuum is applied to the air bearing and the placement tip, as a result of which the placement tip complete with component is fixed to the holder.

Particularly in the case of components having a fairly large number of connections, however, a certain minimum force is needed in order to make sure that all connections are dipped in the solder. The permitted force may therefore lie within a narrow tolerance range.

The object of the invention is to maintain with great accuracy the application force immediately affecting a component.

According to one aspect, a separable coupling ensures that the coupling elements are safely uncoupled as soon as the component is placed upon the substrate. This complete uncoupling of the holder from the rotary drive at the moment of placement prevents any further forces being applied to the holder from this direction. The starting assumption is that a component does not continue to twist after placement, particularly in the presence of the usual viscous soldering pastes. When setting the application force, coupling forces and spring-loading forces can be ignored, improving both the speed and accuracy of the setting. In particular there is no need for further control measures, for instance in order to compensate for an increase in spring loading. The rotary drive can be designed as a direct drive of a motor shaft, for example, or simply as a drive shaft connected to a drive motor via for instance a gear box.

It needs only a small amount of torque to twist a component into a correct placement position, and in fact such torque can be reliably transferred by a slightly prestressed friction coupling. A correspondingly slight pre-stress also uncouples the rotation axes of the rotary drive and the holder from one another, so that said holder can be accurately guided in a purposely provided pivot bearing, unaffected by the rotary drive.

In certain embodiments, the holder can be changed quickly. Such holders can be provided with different front ends, adapted to the components that have to be directly picked.

However, it is also possible to pick components by means of a specially adapted suction pipette which can be quickly changed and fixed to the adapter on the holder.

In one embodiment, the angular rotation of the holder can be checked in the immediate vicinity of a component.

In another embodiment, the performance of the pick-and-place device is appreciably increased.

One embodiment enables the application force to be checked even more accurately. The hollow, thin-walled, cylindrical holder can be made so light that its intrinsic weight is far less than the required application force and any bulk forces which occur remain correspondingly low, so that for the most part the application force is defined by the adjustable pressure device. After the placement of a component on a substrate, it is usual to change the vacuum to a short pressure pulse, in order to ensure that the component adheres securely to the substrate. It is further customary to feed the pneumatic line to the suction tip through a hole drilled in the center of the holder. Enlarging the interior of the holder results in a buffer volume that delays the transfer of the pressure pulse and would therefore reduce placement performance. By making sure that the pneumatic line to which the invention relates is separated from the said interior, the internal volume is appreciably reduced and the vacuum at the holder tip can very quickly be turned into a deliberate pressure pulse.

One embodiment enables the application force to be set even more accurately in that air bearing is completely free from hysteresis and friction in both the direction of rotation and the direction of axial movement. The holder has no need of further supporting elements which could increase its mass. Axial pressure actuation by means of pressurized gas (produced by a pressure device) requires no additional coupling elements on the holder. The gas pressure is distributed evenly over the whole surface cross-section of the holder, so that the point at which forces are in equilibrium is in the center and no tilting moments can occur. A pressure sensor can be used to set the gas pressure accurately to a preset value even before placement. In a combination of this kind the slight mass of the holder is the only interference variable, but this can easily be overcome by controlling the rate of descent of the placement unit. In the event of a higher weight of parts without spring suspension, as for instance according to document U.S. Pat. No. 6,178,621 B mentioned above, a pressure control device would be necessary during the placement procedure, but is not needed according to the present invention.

The ventilation slot effectively uncouples the air bearing pneumatically from the actuation pressure of the holder.

In one embodiment, the pressure volume above the holder is increased so that any increase in pressure when the holder moves in is negligible.

In the embodiment according to claim 11, the pressure volume above the holder is increased so that any increase in pressure when the holder moves in is negligible.

The invention will be explained in greater detail below with reference to an exemplary embodiment shown in the drawings in which;

FIG. 1 shows a longitudinal section through a placement unit according to the invention in its starting position, FIG. 2 shows a partial section through said placement unit along the line II-II in FIG. 1 in an operating position, FIG. 3 shows a section through said placement unit along the line III-III in FIG. 2.

According to FIGS. 1, 2 and 3 a carrier 1 of a placement head 2 is maneuverable in two horizontal coordinate directions X and Y parallel to a substrate 3. The carrier is provided with a vertical linear guide 4 in which a placement unit 5 can be moved in a further coordinate direction Z by means of a lifting drive 28 of the carrier 1. An electrical rotary drive 7, located in a housing 6 of the placement unit 5, engages on the under side with a drive shaft 8 in a coaxially arranged piston-type holder 9 intended for an electrical component 10. The holder 9 can be rotated and moved lengthwise inside a cylindrical air bearing 11.

At its end facing the rotary drive 7, the mainly hollow, cylindrical holder 9 has an end wall 12 through which the drive shaft 8 projects. On the side of the end wall 12 facing away from the rotary drive, a washer disk 13 is fixed on the drive shaft 8, and retains the end wall with the aid of laterally projecting aliform arms. In the operating position shown in FIG. 1, the underside of the end wall 12 is under axial prestress on the upper side of laterally projecting arms of the washer disk 13. The frictional force is strong enough to reliably transmit the rotation of the rotary drive 7 to the holder 9, so that the component 10 can be oriented and placed in the required position on the substrate 3.

The end wall 12 has an opening 15, the contour of which is adapted to the washer disk 13, with play, and extends perpendicularly to the lengthwise direction of the washer disk 13. In a placement position rotated through 90°, it is then possible to pass the end of the drive shaft 8, with the washer disk 13 attached, through the end wall 12. The drive shaft 8 is then rotated relative to the holder 9 until the lateral arms of the washer disk 13 are on rotary stops 14 (not shown in FIGS. 1 and 3) of the end wall 12, so that the holder 9 with the drive shaft is locked in the manner of a bayonet fastening and prevented from descending in the Z coordinate direction.

Above the end wall 12 a closed hollow space 16 is formed in the placement unit 5 and is linked to a connected compressed air line 17. The incoming compressed air constitutes a pressure device which presses the end wall 12 against the washer disk 13. The end wall 12 and the washer disk 13 constitute the coupling elements of a friction clutch in which the sides facing one another act as coupling surfaces 18. Said surfaces are so strongly deformed by the pneumatic compressive force that they reliably transmit the slight torque required to rotate the holder 9 complete with the component 10.

The air bearing 11 is formed in a guide bushing 19 which extends over the hollow space 16 and is provided with narrow radially drilled holes (not shown) that are connected to a further compressed air line 20. Arranged in the guide bushing 19 between this region and the upper end of the holder 9 is a surrounding ventilation slot 27 which prevents the unchecked spillage of waste air between the two compressed air regions, so that both regions remain free from mutual pressure interactions.

In the area of its guideway the holder 9 is in the form of a hollow, thin-walled cylinder, the interior 21 of which has a correspondingly large volume, so that the weight of the holder 9 can be kept very low. The interior 21 is pneumatically separated by a closed bottom plate from a vacuum line 22 for drawing the component 10 onto the holder 9. At its lower end the holder 9 has an adapter 23 to which is attached a suction pipette 24, the function of which is assigned to the holder 9. However, it is also possible to design the holder tip itself as the suction pipette, which will then draw up the component 10 directly.

Via the adapter 23 a disk shaped angle scale 25 is attached to the holder 9, said scale being detected by a stationary sensor 26 attached to the housing 6. By this means the rotation of the holder 9 by the rotary drive 7 can be measured in the immediate vicinity of the component 10, so that a possible transmission error has no effect.

According to FIG. 2 the placement unit 2 is lowered by the lifting drive 28 in the Z direction until the component 10 is placed on the substrate 3. At this moment the holder 9 is pushed into the hollow space 16 such that the prevailing gas pressure defines the maximum application force. It is therefore advantageous for it to be possible to set the controllable gas pressure accurately beforehand. Different components require different application forces, which are obtained by applying different pressures. At the moment when the holder 9 moves in it is stopped and pressed into the remainder of the placement unit. This relative movement can be detected by a suitable sensor, triggering the immediate braking of the vertical movement. Immediately upon placement, the end wall 12 is completely separated from the washer disk 13, so that no further bulk forces and coupling forces affect the holder 9.

REFERENCE CHARACTERS x, y, z Coordinate direction
1 Carrier
2 Placement head
3 Substrate
4 Linear guide
5 Placement unit
6 Housing
7 Rotary drive
8 Drive shaft
9 Holder
10 Component
11 Air bearing
12 End wall
13 Washer disk
14 Rotary stop
15 Opening
16 Hollow space
17, 20 Compressed air line
18 Coupling surface
19 Guide bushing
21 Interior
22 Vacuum line
23 Adapter
24 Suction pipette
25 Angle scale
26 Sensor
27 Ventilation slot
28 Lifting drive

The invention claimed is:

1. A placement unit for mounting electric components onto substrates, the placement unit comprising:
means for moving perpendicularly to the substrate,
a housing,
a built-in, rotatable holder for the components and, an electrical rotary drive for the holder mounted within the housing, the holder connected via an axially elastic coupling to the rotary drive in a manner which is at least temporarily torsionally rigid, wherein the coupling comprises a separable coupling having coupling elements arranged to be uncoupled in an axial direction, and wherein the holder is pre-stressed axially toward the component against the rotary drive by an adjustable pressure device, the coupling surfaces of the coupling elements form an axial stop for the holder, and the coupling surfaces separate from one another by an axial application force that acts on the holder and prevails over the axial pre-stress.

2. The placement unit according to claim 1, wherein the coupling is a friction clutch having coupling surfaces of the coupling elements extending perpendicularly to the axis of rotation.

3. The placement unit according to claim 1, wherein the coupling is arranged such that it can be rapidly separated and the holder can be exchanged.

4. The placement unit according to claim 1, wherein the holder is mounted in the housing such that the holder can be moved axially, and the holder is connected in the manner of a bayonet fastening to a drive shaft of the rotary drive.

5. The placement unit according to claim 1, wherein the holder includes an adapter for attaching a detachable suction pipette for the component.

6. The placement unit according to claim 1, wherein the holder includes an angle scale and that a sensor for the angle scale is provided on the housing.

7. The placement unit according to claim 1, wherein the holder has a hollow, cylindrical interior, and wherein the placement unit further comprises a vacuum line coupled to a free end of the holder arranged so as to be pneumatically separated from the hollow, cylindrical interior of the holder.

8. The placement unit according to claim 7, wherein the holder is mounted in a cylindrical air bearing in which the holder is movable axially, and wherein the holder at an end facing the rotary drive is configured to be impinged upon by a pressure-adjustable gas in a maimer of a pressure piston.

9. The placement unit according to claim 8, further comprising a surrounding ventilation slot arranged between an air gap of the air bearing and a section of the holder impinged upon by the gas.

10. The placement unit according to claim 8, wherein the hollow, cylindrical interior of the bolder is connected to the end of the holder facing the rotary drive.

* * * * *